(12) United States Patent
Zarnowski et al.

(10) Patent No.: US 7,057,150 B2
(45) Date of Patent: Jun. 6, 2006

(54) SOLID STATE IMAGER WITH REDUCED NUMBER OF TRANSISTORS PER PIXEL

(75) Inventors: Jeffrey J. Zarnowski, McGraw, NY (US); Samuel D. Ambalavanar, Rochester, NY (US); Michael E. Joyner, Cortland, NY (US); Ketan V. Karia, Cortland, NY (US)

(73) Assignee: Panavision Imaging LLC, New York, NY (US)

( * ) Notice: Subject to any disclaimer, the term of this patent is extended or adjusted under 35 U.S.C. 154(b) by 296 days.

(21) Appl. No.: 10/673,591

(22) Filed: Sep. 29, 2003

(65) Prior Publication Data

US 2004/0069930 A1 Apr. 15, 2004

Related U.S. Application Data

(63) Continuation-in-part of application No. 09/768,124, filed on Jan. 23, 2001, now Pat. No. 6,633,029, which is a continuation-in-part of application No. 09/490,374, filed on Jan. 24, 2000, now Pat. No. 6,590,198, which is a continuation-in-part of application No. 09/039,835, filed on Mar. 16, 1998, now Pat. No. 6,084,229.

(51) Int. Cl.
*H01J 40/14* (2006.01)

(52) U.S. Cl. ............................ 250/214 R; 250/208.1
(58) Field of Classification Search ............ 250/214 R, 250/208.1
See application file for complete search history.

(56) References Cited

U.S. PATENT DOCUMENTS 5,898,168 A * 4/1999 Gowda et al. ............ 250/208.1

* cited by examiner

*Primary Examiner*—Que T. Le
(74) *Attorney, Agent, or Firm*—Bernhard P. Molldrem, Jr.

(57) ABSTRACT

A solid state imager with pixels arranged in columns and rows has the pixels are configured into groups of at least a first pixel and a second pixel, each said group sharing a pixel output transistor having a sense electrode and an output electrode and a reset transistor having a gate coupled to receive a reset signal and an output coupled to the sense electrode of the associated shared pixel output transistor. Each of the pixels has a photosensitive element whose output electrode is coupled to the sense electrode of the shared pixel output transistor and a gate electrode coupled to receive respective first and second pixel gating signals. This configuration reduces the number of FETs to two transistors for each pair of pixels, and also can achieve true correlated double sampling correction of FPN.

18 Claims, 6 Drawing Sheets

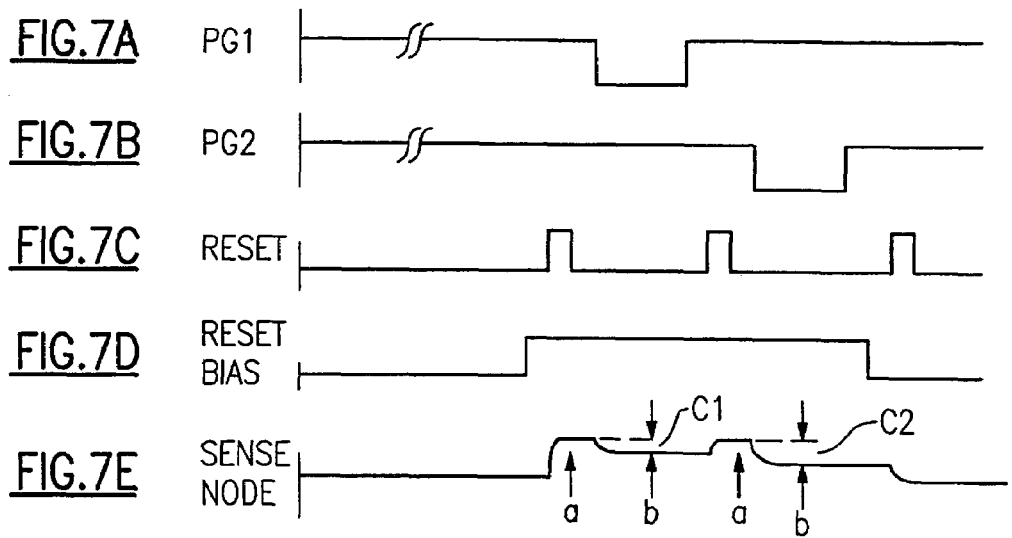
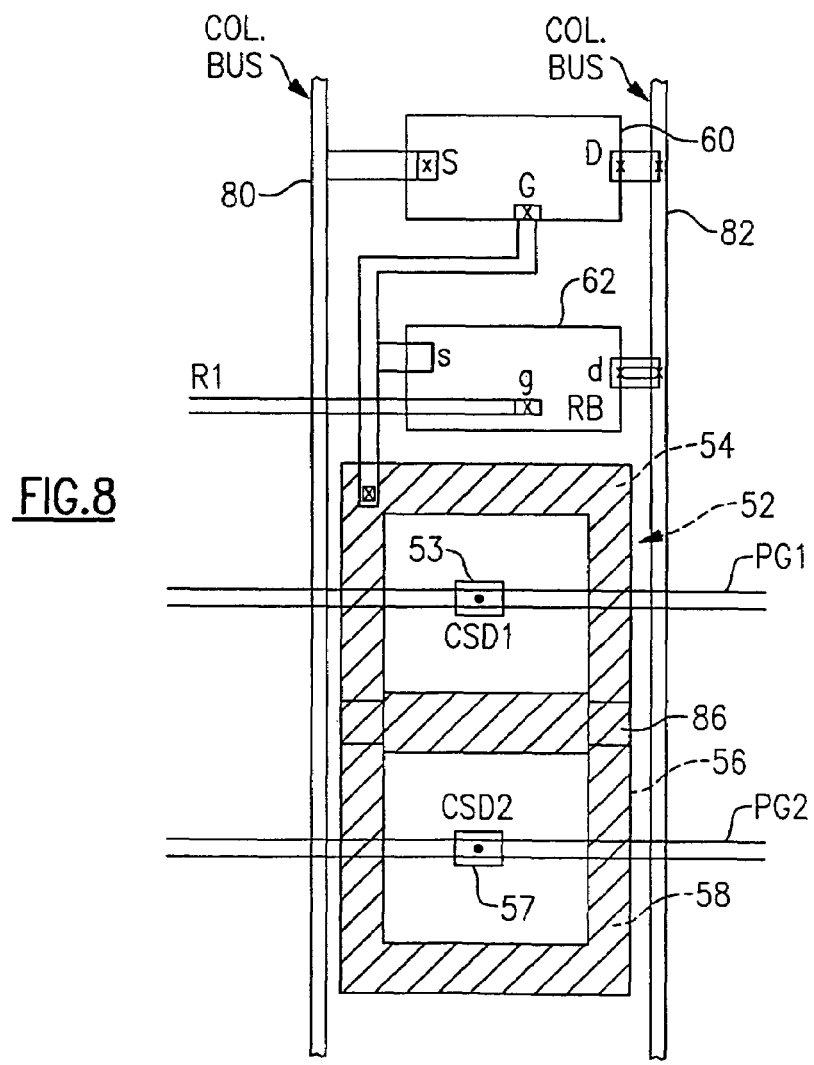

SOLID STATE IMAGER WITH REDUCED NUMBER OF TRANSISTORS PER PIXEL

CONTINUING APPLICATION DATA

This is a continuation in part of earlier patent application Ser. No. 09/768,124 filed Jan 23, 2001 now U.S. Pat. No. 6,633,029, which is a continuation in part of application Ser. No. 09/490,374, filed Jan. 24, 2000, now U.S. Pat. No. 6,590,198, Jul. 8, 2003, issued Jul. 8, 2003 which is a continuation in part of application Ser. No. 09/039,835, filed Mar. 16, 1998, now U.S. Pat. No. 6,084,229, Jul. 4, 2000 issued Jul. 4, 2000.

BACKGROUND OF THE INVENTION

This invention concerns solid state imagers, and in particular is directed to an improved configuration of the pixels within a given column of a solid state imager. The invention is more particularly concerned with a pixel configuration that reduces the number of FETs associated with each given pixel so as to maximize the area available for collection of light.

Solid state image sensors are used in a wide variety of applications, and there has been much interest in pursuing low-cost, high-resolution, high-reliability image sensors for such applications. CMOS technology is well suited for imagers that are intended for portable applications, because of their need for a only a single power supply voltage, their ruggedness, and their inherent low power consumption. There has been great interest in achieving extremely high resolution also, which requires increased pixel density.

In imaging systems, there is a great desire for each pixel to have low noise, a high fill factor, and the smallest possible number of transistors per pixel, while maintaining quality and maximizing yield, i.e., imager chips per wafer. Pixels having only one transistor per pixel have been available only in passive imager designs, which have an inherent high noise threshold. Passive pixel designs are pixels that do not buffer the photon-generated charge during read out, with the result that there is either high noise, such as with photodiodes and charge-injection devices (CIDs) or else the information is destroyed during read out, as in charge-coupled devices (CCDs). The single FET per pixel is thus used only for addressing during reading, and not for buffering.

Imager designs that employ pixels that buffer their signal prior to read out are known, such as active pixel sensors (APSs) and active column sensors (ACSs). These designs typically have three FETs per pixel, and achieve a much lower thermal noise than seen in passive pixel designs. However, because much of the available surface area of each pixel is occupied by these transistors, and by various power and control wires that have to cross the pixels, there is less area available for the active photosensor elements.

The ideal imager will have its pixels designed to have low noise, a high fill factor, require few or no transistors, a 100% manufacturing yield, and close to zero unit cost.

Active pixel sensors, or APS sensors suffer from fixed-pattern noise or FPN and typically require three or more transistors per pixel. Numerous APS designs have added many extra FETs to overcome FPN, with some designs having as many as thirty-seven FETs per pixel (S. Kleinfelder, S. Lim, X. Liw and A. El Gamal, "A 10000 Frames/S CMOS Digital Pixel Sensor," IEEE Journal of Solid State Circuits, Vol. 36, No. 12, December 2001). However, adding more transistors to each pixel reduces the fill factor and increases the unit cost for the imager.

ACS imagers enjoy very low fixed pattern noise, but still require at least two FETs, and normally three to four FETs per pixel, and reducing the number of FET's below this requirement will increase manufacturing yield as well as improve fill factor. An active column sensor (ACS) architecture has recently been developed, as disclosed in Pace et al. U.S. Pat. No. 6,084,229, which permits a CMOS image sensor to be constructed as a single-chip video camera with a performance equal to or better than that which may be achieved by CCD or CID imagers.

As mentioned above, APS and ACS sensors have three to four FETs for each pixel. As APS sensors suffer from FPN, many designs have added extra FETs to minimize this source of noise and distortion. Also pixel complexity has increased in many designs in order to provide additional pixel functions, such as shuttering capabilities for exposure control. However, even with only three FETs per pixel, a 1.3 mega-pixel imager will require 3.9 million transistors for the pixel array alone. The three transistor limit how small each pixel can be for a given set of process rules. Once most of the pixel area has been consumed by transistors, there is little room left to collect light, and so the conventional approach is to add micro-lenses to the imager to increase the fill factor optically. While micro-lenses permit smaller pixel size for a given set of process rules, the micro-lenses add cost to the wafer processing, and require yet another process step that can generate defects and reduce wafer yield. Therefore, the micro-lens approach is less attractive than an alternative that would increase the area of each pixel that is available for collecting light. Also, using fewer transistors per pixel would permit a number of design options, such as maintaining the pixel size and avoiding the need for micro-lenses, or increasing the pixel density by making the pixel size smaller and adding micro-lenses, or else following older and lower cost design rules for the same size pixel and also adding micro-lenses.

In order to obtain the lowest cost for a solid-state sensor, where cost is based on size or total area, it has been a goal to produce an imager which achieves the smallest size possible for an equivalent number of pixels. Typically, this would require reducing pixel size or size of the photosensitive areas down to the design limits of the process. This is especially important if the same chip has to devote a significant amount of area for its various output multiplexers and output amplifiers. Ideally, size reduction should be achieved, not by reducing the pixel photosensitive areas, but rather by reducing the area consumed by the other circuitry which is located within the pixels.

By combining the ACS technology of U.S. Pat. No. 6,084,229 and an improved pixel structure of U.S. Pat. No. 6,232,589, that is, a so-called Charge Snare Device or CSD, a pixel can designed that needs only two FETs per pixel. One of the two FETs is a sense FET, or pixel output transistor, that forms a part of the pixel column amplifier, and the other FET is a reset FET, which is needed to reset the sense node at the gate of the sense FET. In the CSD pixel arrangement, two of the usual FETs found in the prior photo-gate design, namely, the transfer FET and the select FET, are eliminated.

In the CSD-based imager of U.S. Pat. No. 6,232,589, the pixels operate without a separate selection gate. First the sense node, i.e., the input to the pixel output amplifier FET, is set to ground by gating the reset FET (which is an N-FET), so that the sense node FET is biased off and therefore isolated from the rest of the shared FETs in the same column. Thereafter, addressing of the sense FET is carried out by resetting the sense node FET from ground to 2.5 volts (for a 3.3 volt process). The photon-generated charge is collected by the photogate when a bias is applied and the active region of the silicon has been depleted. After the desired integration time, the sense node FET is selected by setting it to 2.5 volts, as just discussed. The collected photon-generated charge is transferred to the sense node when the bias applied to the photogate is removed, e.g., to 0.0 volts. The sense node, which is tied to the gate of the sense FET, physically surrounds the photogate, either completely or nearly so. The sense node connects with the gate of the sense node FET and the drain of the reset FET, as well as the sense gate of the CSD. The collected photon generated charge drifts and diffuses to the sense node. The sense node captures all or nearly all the collected charge at the photogate, as the photon-generated charge is surrounded or "snared." This technique of sensing photon-generated charge has very low noise, as the thermal noise on the sense node can be removed by first sampling the sense node just after reset to measure background that contains such noise, and then remeasuring the sense node after the photon-generated charge has been transferred, and taking the difference between these two measurements as a pixel output. The thermal noise that is generated is correlated and subtracted, that is, the device carries out true correlated double sampling or CDS.

It would be desirable to use the same general concepts to create an imager in which the pixels had only a single FET associated with the photogate thereof, and which had the advantages of low noise and true CDS, but a single-FET design has eluded those working in this art.

OBJECTS AND SUMMARY OF THE INVENTION

Accordingly, it is an object of the present invention to provide a solid-state imager that avoids the drawbacks of the prior art.

It is another object to provide an imager that increases the amount of each pixel that is occupied by its photosensitive portion, without encountering other problems, such as fixed pattern noise.

It is another object to simplify the pixel structure of the solid state imager.

Likewise, it is an object to provide a solid-state imager that achieves a reduction in the number of FETs required, i.e., requiring on average a single FET per pixel.

In accordance with one aspect of the present invention, a solid-state area or linear imager is made as an array of pixel elements extending in columns and rows. The objective of reducing the number of FET's per pixel is achieved by sharing the reset and sense node FETs between two or more photo sensitive regions, i.e., between two or more pixels. This is possible because the sense node is idle for the overwhelming majority of the time, during which frame integration takes place, and the sense node is only actuated for a very brief interval just after a given row is reset for selection and reading of the pixel information. The pixel (e.g., charge snare device) that has a gate signal applied to it is the pixel that has its photon-generated charge transferred to the sense node. The sense node can be a photogate as discussed, or may alternatively be a reverse-biased diode, as the signal timing is the same for either.

According to any of a number of embodiments of the invention, the photosensitive array is comprised of a plurality of pixels arranged in columns and rows, wherein the pixels are configured into groups of at least a first pixel and a second pixel. There may be two or more than two pixels in the group sharing the FETs. A shared pixel output transistor, i.e., the sense FET, has a sense electrode and an output electrode, and a shared reset transistor has a gate coupled to receive a reset signal and an output, i.e., drain, coupled to the sense electrode of the associated shared pixel output transistor. Each of the first and second pixels has a photosensitive element with an output electrode coupled to the sense electrode of the shared pixel output transistor, and a gating electrode coupled to receive a respective first and second pixel gating signal.

The pixels of the group that share a common FETs can be in successive rows in the same column, or can be in adjacent columns in the same row. The group of pixels can comprise four pixels sharing a single output FET, or four pixels with two sharing one output FET and one reset FET and the other two sharing a second output FET and a second reset FET. By controlling the timing of the gate and reset signal, it is possible to "bin" or combine the photon-generated charge from the two pixels. Banning is useful for increasing sensitivity in low-light level environments. The imager can be configured as monochromatic or polychromatic (i.e., color), and the shared FET architecture of this invention can be used to great advantage where a Bayer pattern of color pixels is employed.

The solid-state imager of this advantage has the advantages of fewer FETs and fewer metallized strips or wires to carry signal and power to the pixels. This leaves more pixel area available for light collection, and also results in a significantly lower manufacturing scrap rate, i.e., higher manufacturing yield and reduced manufacturing costs.

The above and many other objects, features, and advantages of this invention will be more fully appreciated from the ensuing description of a preferred and exemplary embodiment, which is to be read in conjunction with the accompanying Drawing.

BRIEF DESCRIPTION OF THE DRAWING

FIG. 7A to FIG. 7E are timing charts for explaining the operation of the FET per pixel sensors of the embodiments of this invention.

FIG. 8 is a diagram of a pixel layout of an embodiment of this invention.

DETAILED DESCRIPTION OF THE PREFERRED EMBODIMENT

Figure 1:
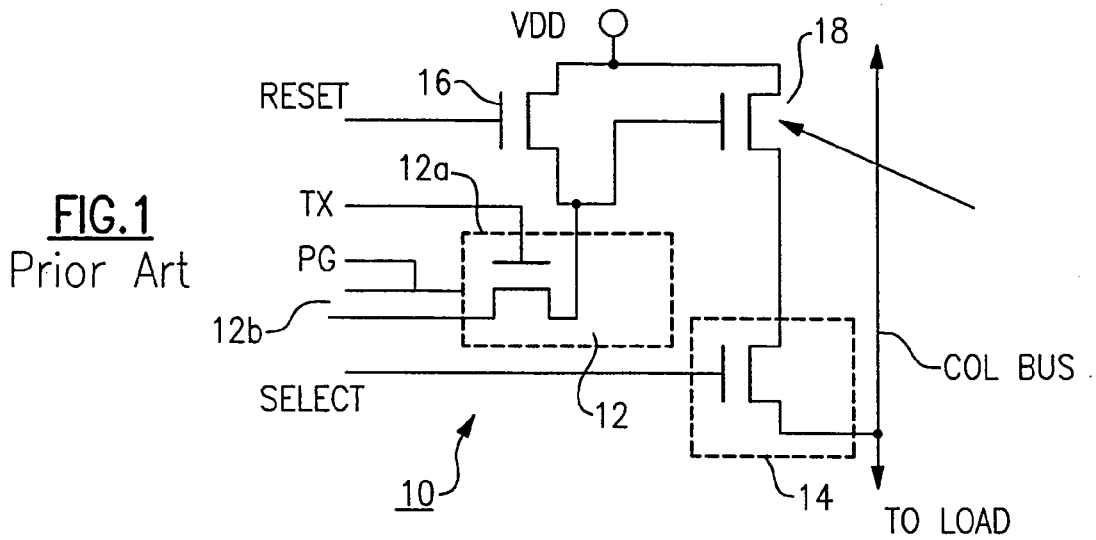
FIG. 1 is a schematic diagram of an active pixel sensor configuration of the prior art.

With reference now to the Drawing, and initially to FIG. 1 thereof, a CMOS imager 10, of the type that is known as an Active Pixel Sensor or APS, is shown here with a rather large number of components, including a photogate 12 which is the light sensitive member, with a transfer FET 12a, a row select transistor 14, a reset transistor 16, a sense FET 18, and various metallized leads including the row select lead SELECT, photogate lead PG, transfer lead TX, reset lead RESET, input drain voltage VDD, and output column bus COL BUS, which is connected to an output load. The APS imagers tend to have at least three and often many more FETs for each pixel, with pixel complexity increasing in many designs due to the addition of other pixel functions such as shuttering capabilities for exposure control. Even with only three FETs per pixel, a 1.3 megapixel imager will have 3.9 million transistors in the pixel array alone. The three transistors are a lower limit of complexity in the APS system, and limit how small a pixel can be for a given set of process rules. Once most of the pixel area has been consumed by the transistors, there is little area left for collecting light. In many cases, microlenses are added to increase the light collection or optical fill factor, by concentrating the light into one portion of each pixel. However, this technique does add to the complexity, and hence cost, of the imager, and adds another step that can generate defects and hence reduce wafer yield. Therefore, it would be preferable, if possible, to employ fewer transistors and increase the photosensitive area of each pixel, or else (using microlenses) to reduce pixel size even further. By reducing the number of transistors per pixel, it would also be possible to reduce processing costs and increase reliability and yield, even if the pixel size is unchanged.

Active Column Sensor technology has been described earlier, e.g., in Pace et al. U.S. Pat. No. 6,084,229, which is incorporated herein by reference. Active Column Sensor (ACS) architecture can be applied to either a linear array or to a two-dimensional array. An illustration of an ACS imager is shown here in FIG. 2. As explained in U.S. Pat. No. 6,084,229, each pixel has a photodiode 22, and a pair of FETs in series, that is, a sense FET 24 and a select FET 26 incorporated into it, with the source electrode of the sense FET 24 and the drain electrode of the select FET 26 being connected by means of a pair of vertical conductors to respective inputs of an associated column amplifier circuit 28. A reset FET 27 has its drain connected with the gate of the sense FET 24. In the ACS sensor, the column amplifier is configured as a closed-loop unity gain amplifier (UGA), thereby ensuring gain and offset uniformity among all pixels of the respective column. The column amplifier 28 is followed by a correlated double sampling (CDS) circuit 30 that corrects for offset voltages while providing a differential output voltage. The outputs of the various column amplifiers are supplied to respective inputs of a multiplexer circuit (not shown) that combines the output levels of the pixels of each selected row, in turn, and this combined output is then fed through a video output amplifier to provide an output video signal. SELECT and RESET signals and Reset Bias are supplied to each row of pixels, in turn, so that the pixel FETs of the selected row connect to the column amplifier 28. This technology has the useful advantages over the prior APS technology of a smaller FET count per pixel, and a capability of cancelling out fixed pattern noise.

Figure 2:
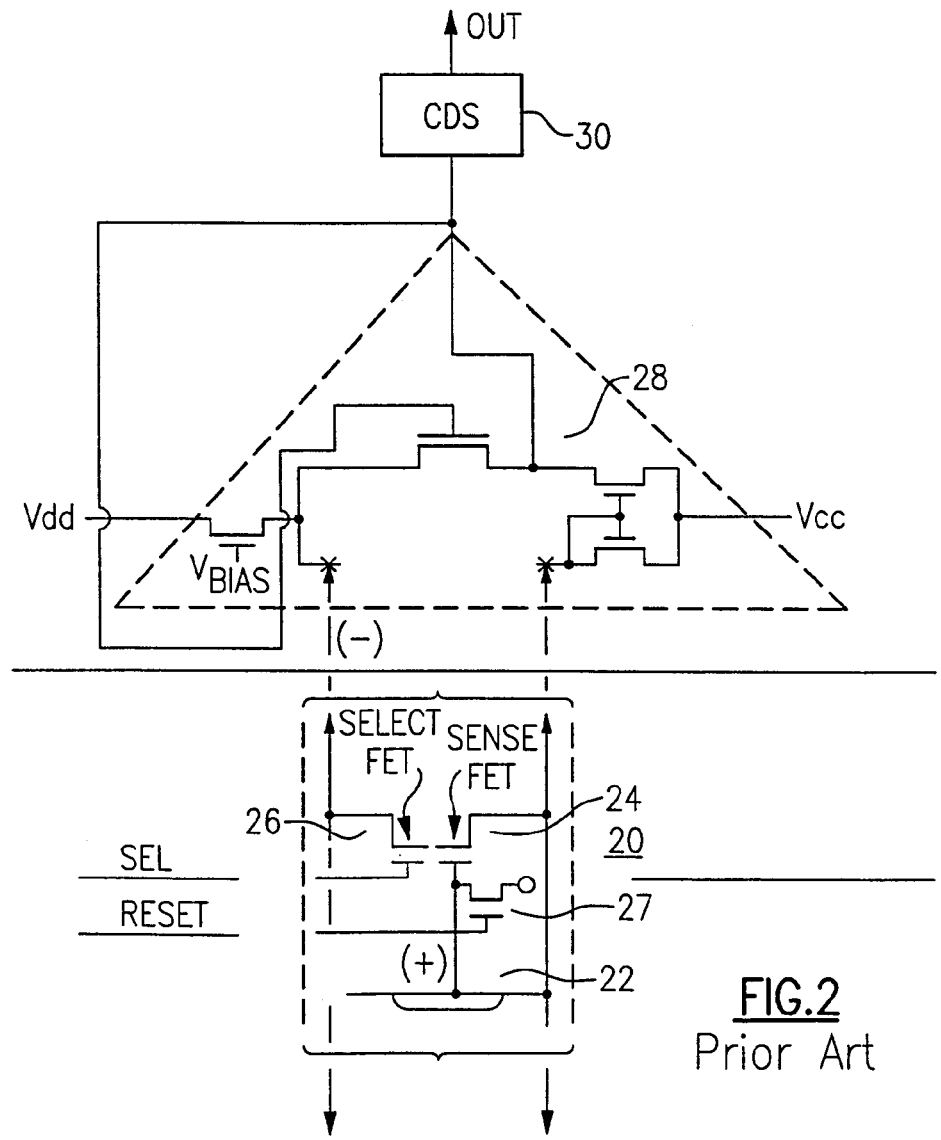
FIG. 2 is a schematic diagram of an active column sensor configuration of the prior art.
Figure 3:
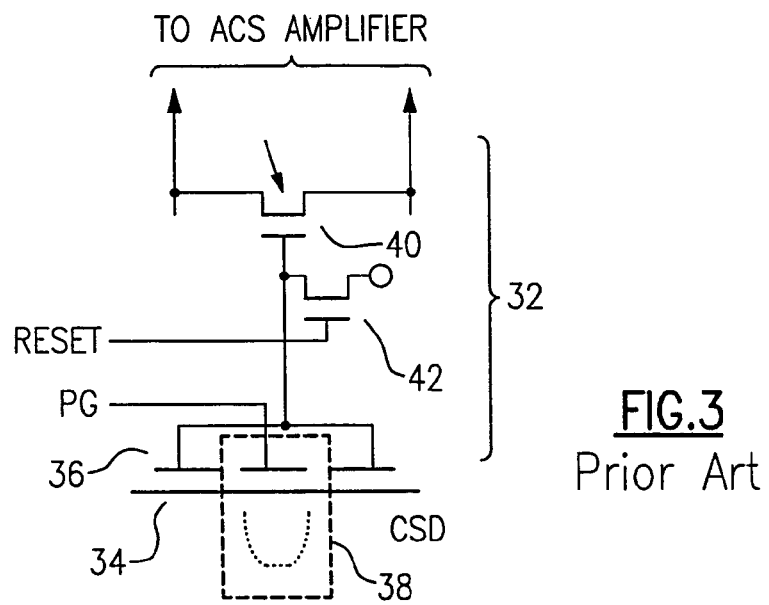
FIG. 3 is a schematic diagram of a two-transistor charge snare device (CSD) of the prior art.

FIG. 3 illustrates the general construction of an imager 32 in the form of a charge snare device as described in Pace et al. U.S. Pat. No. 6,232,589, which is also incorporated herein by reference. In the CSD imager 32 each pixel 34 has a two-FET construction in addition to a sense gate 36. Here a photogate 38 is supplied with a photogate signal PG, and a sense node of the sense gate 36 is coupled to the gate of a sense FET 40. A reset FET 42 has a drain connected to a supply of Reset Bias, a source connected to the sense node, and a gate connected to receive a reset signal RESET. The source and drain electrodes of the sense FET 40 are connected to a column amplifier in the manner as shown in FIG. 2. The CSD architecture results in a two-FET pixel, as a separate selection gate can be avoided. The reset FET 44 is needed to restore the sense node and the gate level of the FET 42. The transfer FET and the row select FET are eliminated.

The operation of the CSD imager is straightforward. The sense node is set to ground (reset bias) by actuating the reset FET 42 (in this example, the reset FET 42 is an N-FET). Then the sense node is biased off, and is therefore isolated from the rest of the shared FETs in the column. Thus, addressing of the sense FET 40 in this example is carried out by resetting the sense node from ground to 2.5 volts (for a 3.3 volt process). The photon-generated charge is collected by the photogate 38 when a bias is applied and the active region of the silicon (shown in dash lines) has been depleted. After the desired integration time, the sense node is selected by resetting it to 2.5 volts via the reset FET 42. The collected photon-generated charge is transferred to the sense node, i.e., to the gate of the sense FET 40, when the reset transistor is gated off and the bias applied to the photogate 38 is removed. As explained in the U.S. Pat. No. 6,232,589, the sense gate 36 of the pixel image area at least substantially surrounds the photogate 38, and preferably completely surrounds the photogate 38. In this architecture, the sense node is comprised of the sense gate 36, the gate electrode of the sense FET 40 and the drain of the Reset FET 42. The collected photon-generated charge drifts and diffuses to the sense node, which captures all or nearly all the collected charge of the photogate 38, such that the photon-generated charge of the photogate is surrounded or "snared." This technique of sensing the photon-generated charge has very low noise, as the thermal noise or KTC noise on the sense node can be removed by first sampling the sense node just after reset (to measure the background that contains KTC noise) and then re-measuring the sense node level after the photon-generated charge has been transferred to it, and employing the difference of the two levels as an output. The KTC noise that is present is correlated and is subtracted out for true Correlated Double Sampling or CDS.

Figure 4:
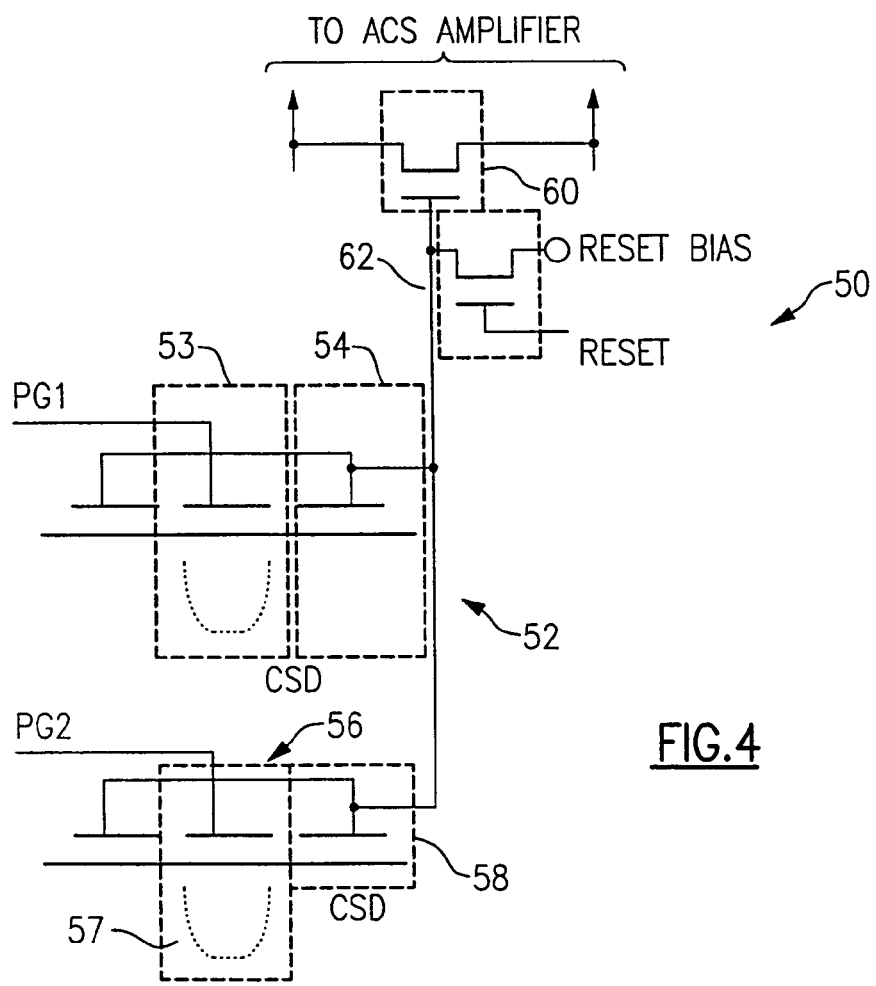
FIG. 4 is a schematic diagram of a pair of pixels that share a common ACS amplifier transistor and reset FET, according to one possible embodiment of this invention.

An arrangement that reduces the number of FETs per pixel is shown in FIG. 4, in which the sense or output FET and the Reset FET are shared between two (or more) pixels of a column, or in the same row in adjacent columns. Here, a pair 50 of pixels includes a first pixel device 52 formed as a charge snare device with a photogate 53 and a sense gate 54, and a second pixel device 56 also with a photogate 57 and a sense gate 58. The sense gates 54, 58 form a part of the sense node together with a gate electrode of an output or sense FET 60 that is common to both pixel devices 52 and 56. A common reset bias FET 62 has its source connected to the sense node, and has drain and gate terminals connected to a supply of reset bias and to a line that supplies a RESET signal, respectively. The photosensitive regions or pixel devices can be composed of either photodiodes of photogates. The sense node is available for sharing between the two pixel devices 52 and 56 because the sense node is idle for the overwhelming majority of the time during frame integration and is only utilized for a small period of time just after a row is reset for selection and reading of the pixel information. Timing for a sense node that is either a reverse biased diode or a photogate is the same. Each pixel device accumulates photon-generated charge and each has its charge transferred to the sense node only at the time that the pixel device is to be read.

A simple form of the embodiments of this invention can be implemented with the two pixel devices of each pair located in successive rows in the same column. Actually, if the sense node is common between any two pixels in the same column, the operation would be the same. The readout of each pixel occurs by first resetting the sense FET 60 to the reset value, e.g., 2.5 volts, by actuating the reset FET 62. The readout of the photogate 53 comes by application of a gating signal PG1, and readout of the pixel value is accomplished by removing the bias from the photogate 53, e.g., going from 2.5 volts down to 0.0 volts, after the desired integration time. To read out the pixel value of the other pixel device 56, the process is repeated, but using a gating signal PG2 for controlling the photogate 57. This technique has a benefit of allowing true summation of pixels that are common to the same sense node, that is, a process commonly referred to a "binning." Binning is accomplished by transferring the photon generated charge onto the sense node from both pixel devices 52 and 56 at the same time, after the sense node FET 60 has been reset.

The embodiments such as the one described in connection with FIG. 4 have an architecture of two FETs for each pair of pixel devices, i.e., one FET per pixel, as the two FETs are shared between two pixels.

Figure 5:
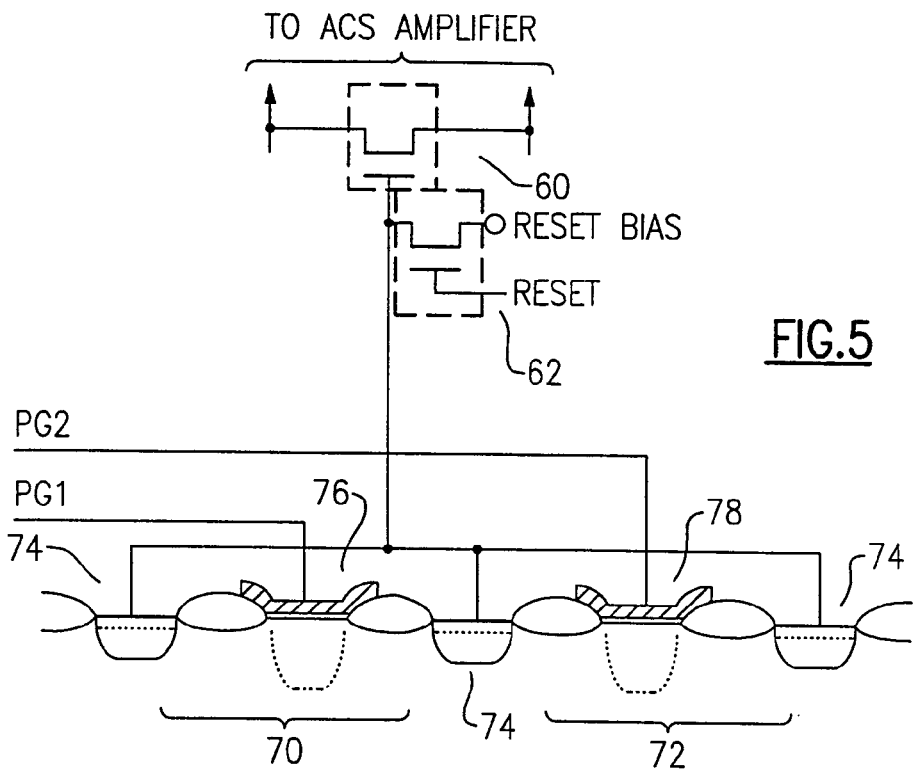
FIG. 5 is a schematic diagram of another embodiment of this invention.
Figure 6:
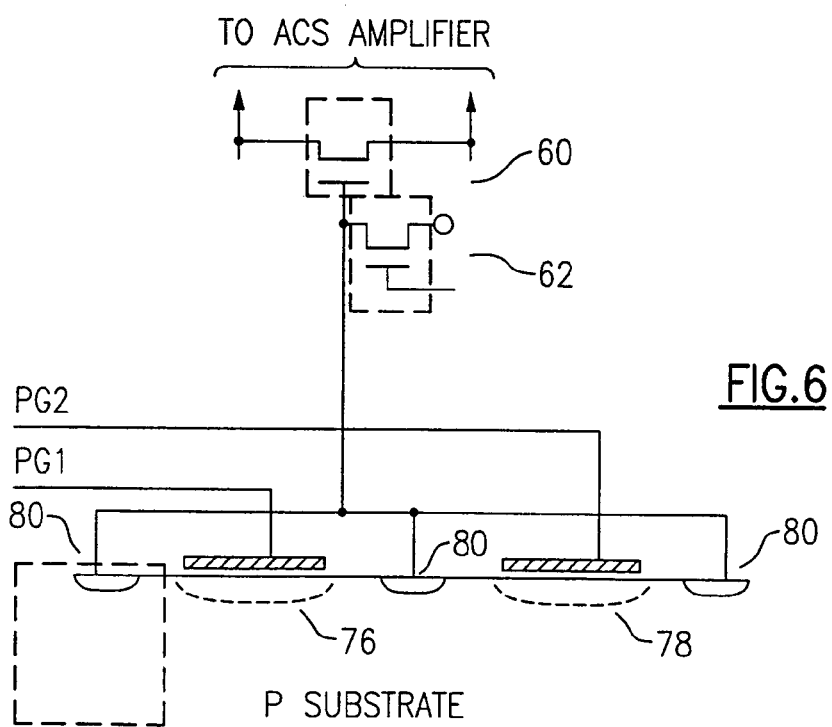
FIG. 6 is a schematic diagram of another embodiment.

FIG. 5 illustrates an embodiment in which two pixels in the same row (and in adjacent columns) can share the same pixel amplifier FET 60 and the same reset FET 62, and share the same sense node. Here, the shared sense node along a common row is associated with a pair of photogate elements 70 and 72, with nodes controlled by photogate signals PG1 and PG2. The timing of signals is the same as described above in connection with the embodiment of FIG. 4. Here, there is a common conductive element 74 surrounding each of the photogates 76 and 78 of the respective pixels and defining the sense gate for both pixels. Photogates 76 and 78 for both pixels are isolated from the sense node in this illustration using field oxidation; any processing method of isolation including shallow trench, implants, and physical distance can provide the necessary separation between the sense node and photogates. The photogates herein are of polysilicon construction; but can also be a pinned photodiode, or any optical gate construction including an implanted virtual gate often used in CCDs, including the HyperHAD construction offered by Sory Corporation. This element 74 and the gate of the FET 60 define the sense node. In this embodiment, the element 74 can be formed of an N+ or N− region, with an optional P+ surface implant to minimize surface defects and the resulting dark current, and a metallization can be used for the photogates 76 and 78. An alternative arrangement is illustrated in FIG. 6, wherein, in place of the element 74, a well 80 of N+ or N− material is used. Other elements shown in FIG. 6 can be identical with what is shown in respect to FIG. 5.

FIGS. 7A to 7E show the signal timing sequence for reading out the optical signal from any of the three embodiments described just above. Initially, at the commencement of a readout sequence, the Reset Bias level goes from low to high (FIG. 7D), and permits sampling of background readout values. For the first of the two pixel elements of the pair, i.e., 52 or 70, the reset gating pulse RESET (FIG. 7C) samples the background value (a in FIG. 7E) by removing bias on the element 54 or 74, and then the photogate signal PG1 (FIG. 7A) is applied to photogate 53 or 76. This transfers the photon-generated charge onto the common sense node, and provides an output level (b in FIG. 7E). The process is repeated for the second pixel 56 or 72, except using the second pixel photogate signal PG2 (FIG. 7B), producing a respective second background value a and readout output level b as shown in FIG. 7E. The difference values c1 and c2 represent output pixel values that are corrected by means of true correlated double sampling. After readout, a new integration period begins, and other pixels in the array are sampled.

FIG. 8 illustrates, in very general terms, a possible layout for the pixels 52, 56 of the embodiment of FIG. 4, with vertical conductors 80 and 82 constituting a column bus, and horizontal conductors formed to include reset R1 and photogate signal conductors PG1 and PG2. The photosensitive areas are surrounded respectively by a pair of closed-geometry conductors as the sense gates 54 and 58, with one section being common to both sense gates to unify the same. The reset FET 62 and the pixel sense FET 60 are situated here above the two pixels 52 and 56. The sense gates 54, 58 completely surround the respective photogates 53, 57. In other possible embodiments, the sense gate substantially surround, or encompass a majority of the pixel photosensitive area, so as to capture all or nearly all of the photon-generated charge. A reverse-based diode can be used, composed as an N-type well in a P-type substrate. Other reverse biased diodes can be constructed, depending on the actual CMOS semiconductor process used to fabricate the pixels, so long as the sense nodes completely or nearly completely surround the photogates, so as to maximize charge-transfer efficiency or CTE. Ideally, the CTE should be at 100% or nearly 100%; however, in some applications, a known lower CTE can be employed to extend the dynamic range of the sensor.

In the embodiments in which one amplifier and one reset FET are shared between two columns, the layout would be configured in a similar fashion, but with the two pixels arranged side by side in the same row. The arrangement of the pixel amplifier is described in U.S. Pat. No. 6,084,226 and the layout of the pixels using CSD architecture is described in U.S. Pat. 6,232,589.

Figure 9:
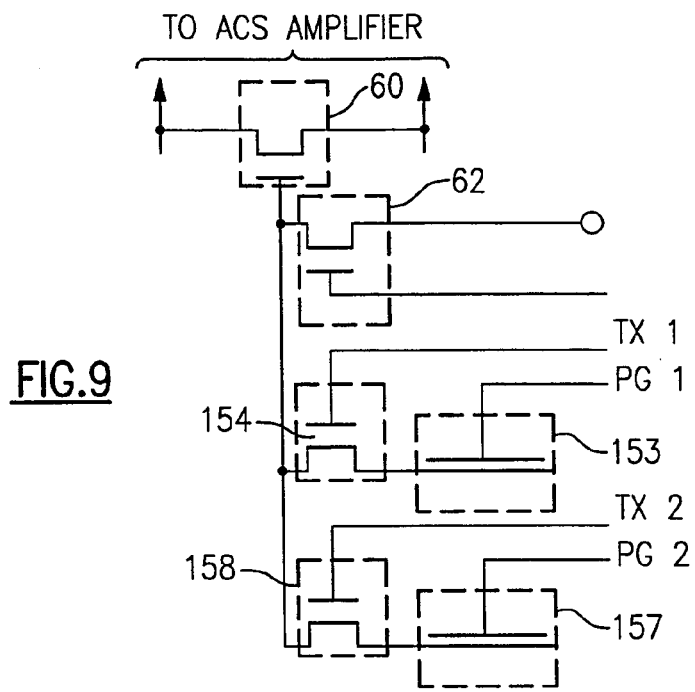
FIGS. 9 and 10 illustrates further embodiments of the invention, employing transfer gate technology.

Transfer-gate based pixel technology can be used in the pixel arrays according to this invention, and an example is shown here in FIG. 9. In FIG. 9, elements that are shared in common with the schematic of the embodiment of FIG. 4 are identified with similar reference numbers. Here, instead of CSD pixel devices, a first pixel is formed of a photogate device 153 and a transfer gate FET 154 connecting the same to a common sense node, with the second pixel also being formed of a photogate device 157 and a transfer gate FET 158. In this embodiment, additional conductors are provided in each row to bring transfer signals TX1 and TX2 to the transfer gate FETs 154 and 158. The pixel sense FET 60 and reset FET 62 are shared with both pixels, as in the previous embodiment. The readout sequence is also similar to those of the previous embodiments, providing true correlated double sampling or CSD.

Figure 10:
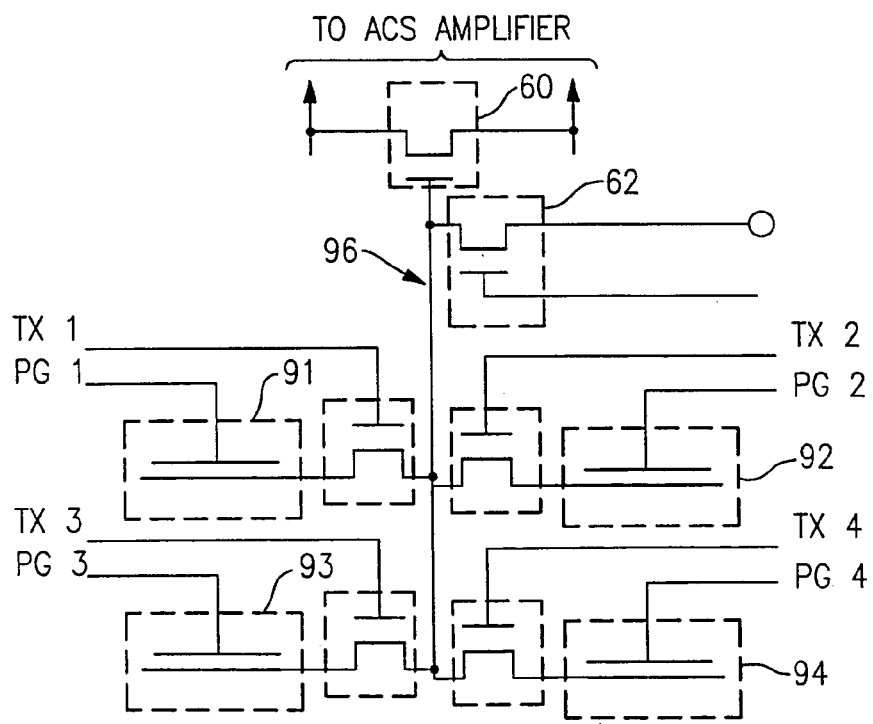

An embodiment of this invention in which the sense FET 60 and the reset FET 62 are shared by a larger number of pixels is illustrated in FIG. 10. Here, there are four pixels 91, 92, 93, and 94, in each of two rows in two adjacent columns. The pixels here are formed using transfer gates, as in FIG. 9. However, other technology, such as CSD technology, could be used. Signal conductors are provided to transfer signals TX1, TX2, TX3, and TX4 and for photogate signals PG1, PG2, PG3, and PG4. The four transfer gates of these pixels all feed into a common sense node 95 that is connected with the gate of the pixel sense FET 60 and the drain of the reset FET 62. The four pixel arrangement as shown here can facilitate binning by reading out two of the pixels at the same time, or by reading out all four. True additive binning can be used for higher speed data transfer or for increased sensitivity. Binning can be carried out on the column axis or the row axis, or diagonally. All four photogates can be replaced by photodiodes (not shown) and the elimination of the four PG control signals. The operation of the photodiodes is similar except resetting the photodiodes to begin integration. Biasing of the photodiodes is by resetting the sense node to the desired starting level of the photodiode and allowing the transfer signals to be ON (e.g., VDD) to bias the photodiode accordingly. Integration for photodiodes begins when thee reset FET is turned OFF (e.g., 0.0 Volts) and the corresponding transfer signal (TXn) is also turned OFF. Binning with photodiodes is not possible as the charge in the sense nodes will instead average with photodiode charge.

Figure 11:
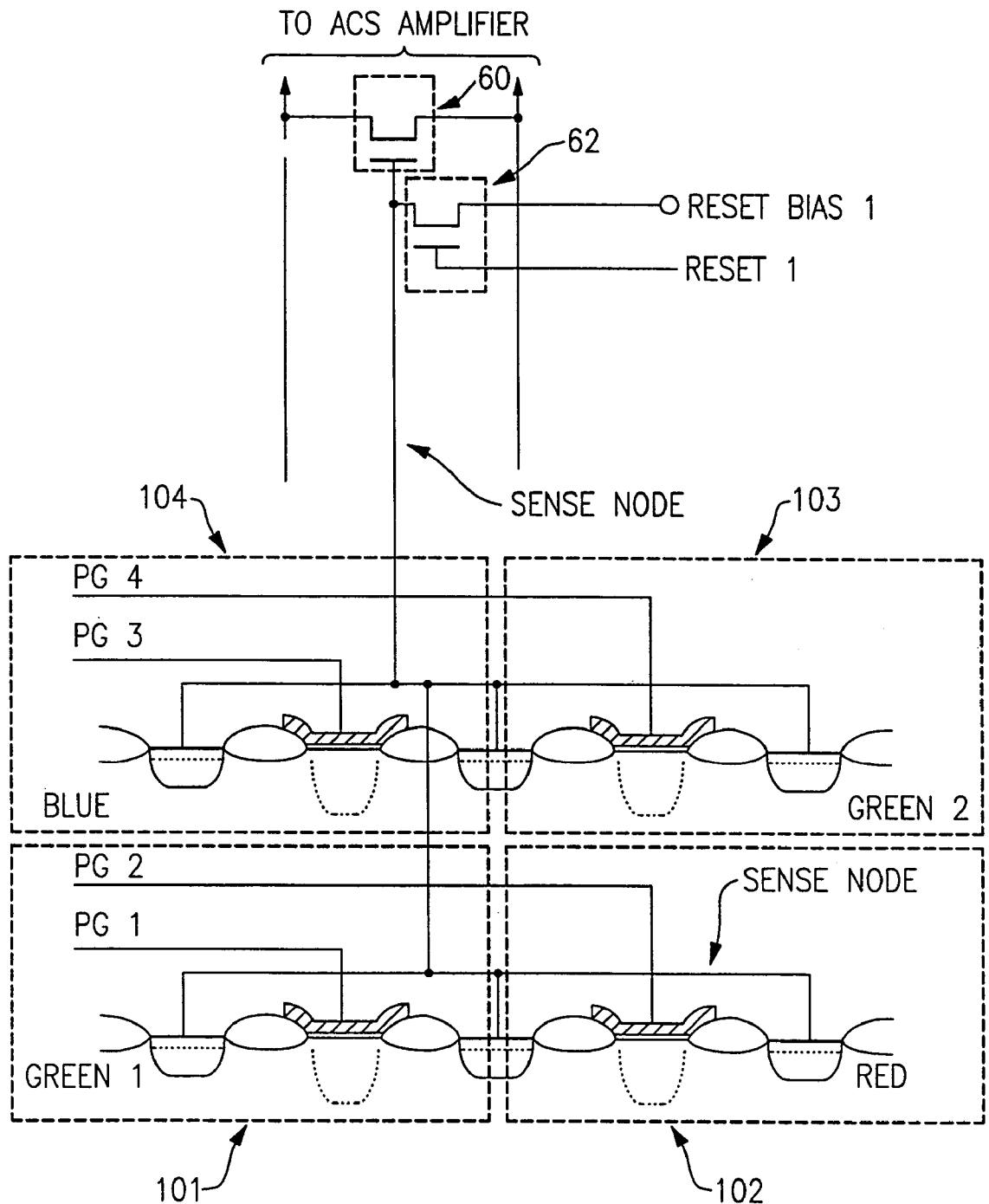
FIG. 11 illustrates an embodiment employing transfer gates and color binning.

FIG. 11 illustrates an embodiment of this invention in which shared sense nodes are used for a color sensor. Here there are arranged on one column a first sense FET 60 and second sense FET 160, with associated reset FETs 62 and 162. Red, green, and blue filters are used, and the pixels are arranged into a Bayer pattern of Green1/Red/Green2/Blue in a two X two matrix. Here, green pixels 101, 102, 103 and 104 share the FETs 60 and 62. If a given application requires a lower resolution image but a higher frame rate or higher sensitivity, the true additive binning of the same color pixels can be easily carried out. This contrasts with the current technology which simply skips over unwanted pixels when it is desired to minimize the amount of data transferred, and which has an additional disadvantage in terms of reduced sensitivity. In this invention, all pixels can be sampled, keeping sensitivity high. Because binning can be carried out here at the level of the pair (or quad) of pixels, there is less need for processing on the periphery of the video imager or for off-chip processing. If all four pixels are binned together for a monochrome image, that would allow low-light-level image acquisition with only one CDS sample per four pixels binned together. The true CDS and the summation (binning) of four pixels allows for very low noise and high dynamic range. Filters can be applied in the same manner to FIG. 10, although that is not shown. Also, different filter configurations can be utilized and the shared sense node can be altered to match filter configuration.

The principle of sharing an output FET and a reset FET, to eliminate the select and/or transfer FET among one or more pixels could be applied to active pixel sensor (APS) imagers, utilizing a source follower configuration and photodiode pixels as well. Another advantage of using a shared node among a two-by-two matrix of pixels is the reduction of the number of distributed amplifiers from one per column to one per two columns, as shown in FIG. 11, with higher reductions possible. With pixel geometries going smaller and smaller it is becoming difficult to place the analog and digital processing circuitry on the same pitch as the pixel. Since the processing circuits are repeated on a column by column basis, if the circuits only have to be repeated every other column, or less frequently, the repeat pitch is doubled for FIG. 11, and higher multipliers are possible if there are more pixels that share the same sense and reset FETs. Previously, the only alternative to the repeat pitch of the processing circuits was to alternate the column electronics, so that even columns had their electronics at the top of the pixel array, and the odd columns had the electronics brought to the bottom of the array (or vice versa). This would in effect break the imager into different sections, as indicated on U.S. Pat. No. 6,590,198 to Zarnowski et al, and as shown in FIG. 5. The video is effectively broken into different sections that are either brought out to different ports (or to different pins on the same package) or can be multiplexed back together. By utilizing this previously described method in addition to the technique of this invention, the repeat pitch can be doubled again, further facilitating the imager designer.

While the invention has been described with reference to specific preferred embodiments, the invention is certainly not limited to those precise embodiments. Rather, many modifications and variations will become apparent to persons of skill in the art without departure from the scope and spirit of this invention, as defined in the appended claims.

We claim:

1. A photosensitive array comprised of a plurality of pixels arranged in columns and rows, wherein the pixels are configured into a multiplicity of groups of at least a first pixel and a second pixel, each group including
   a shared pixel output transistor having a sense electrode and an output electrode; and
   a shared reset transistor having a gate coupled to receive a reset signal and an output coupled to the sense electrode of the associated shared pixel output transistor; and
   said first and second pixels each including a photosensitive element having an output electrode, with both said output electrodes being coupled together to the sense electrode of the shared pixel output transistor and a respective gate electrode coupled to receive respective first and second pixel gating signals.

2. A photosensitive array according to claim 1 wherein said first and second pixels of each said group are both disposed in the same column.

3. A photosensitive array according to claim 1 wherein the first and second pixels of each said group are disposed in successive columns in a single row.

4. A photosensitive array according to claim 1 wherein the photosensitive element of each said pixel includes a photogate that captures and accumulates photon generated charge; a sense gate positioned on said photogate; and a sense node that surrounds the photogate.

5. A photosensitive array according to claim 4 wherein the photosensitive elements of said first and second pixels are adjacent one another and the sense nodes thereof share a segment in common with one another.

6. A photosensitive array according to claim 1 wherein each said photosensitive element includes a sense node FET having a gate electrode.

7. A photosensitive array according to claim 1 wherein each said photosensitive element is formed of a charge snare device.

8. A photosensitive array according to claim 1 wherein each said photosensitive element is formed of a photogate and a transfer gate transistor, wherein one electrode of the transfer gate transistor is connected to a photo diode and another electrode thereof is connected to said sense electrode, and a gate of said transfer gate transistor is connected to receive a control signal to operate timing of transfer and reset of said photodiode.

9. A photosensitive array according to claim 1 wherein seach said photosensitive element is formed of a photodiode and a transfer gate transistor.

10. A photosensitive array according to claim 9 wherein one electrode of said transfer gate transistor is connected to a photodiode and another electrode is connected to said sense electrode, and a gate of said transfer gate transistor is connected to receive a control signal to operate timing of transfer and reset of said photodiode.

11. A photosensitive array according to claim 1 further comprising color filters on said first and second photosensitive elements.

12. A photosensitive array according to claim 1 wherein said groups each include a third pixel and a fourth pixel, each of which includes a photosensitive element having an output electrode coupled to the sense electrode of said shared pixel output transistor, and a gate electrode to receive a respective gating signal.

13. A photosensitive array according to claim 12 wherein said groups each include a second reset transistor.

14. A photosensitive array according to claim 1 wherein said groups each include a third and fourth pixel, each of which includes a photosensitive element having an output electrode, and a gate electrode to receive a respective gating signal; a second pixel output transistor having a sense electrode coupled to the output electrodes of the third and fourth pixel photosensitive elements; and a second reset transistor having a gate coupled to receive a second reset signal and an output coupled to the sense electrode of said second pixel output transistor.

15. A photosensitive array according to claim 1 wherein said reset transistor is an FET having a drain thereof connected to the sense electrode of said pixel output transistor.

16. A photosensitive array according to claim 15 wherein said pixel output transistor includes an FET having its gate electrode connected to the drain of the FET of said reset transistor.

17. A photosensitive array according to claim 1 wherein said group includes at least a third pixel with the third pixel also having an output electrode coupled to the sense electrode of the shared pixel output transistor.

18. A photosensitive array according to claim 1, wherein said group includes first, second, third, and fourth pixels, in a 2×2 arrangement, said pixel having associated output electrodes coupled together to the sense electrode of the shared pixel output transistor.

* * * * *

UNITED STATES PATENT AND TRADEMARK OFFICE
CERTIFICATE OF CORRECTION

PATENT NO. : 7,057,150 B2  
APPLICATION NO. : 10/673591  
DATED : June 6, 2006  
INVENTOR(S) : Jeffrey Zarnowski et al.

Page 1 of 1

It is certified that error appears in the above-identified patent and that said Letters Patent is hereby corrected as shown below:

Col. 12, Claim 18, line 15: "said pixel" should read -- all said pixels --

Signed and Sealed this

Nineteenth Day of September, 2006

JON W. DUDAS  
*Director of the United States Patent and Trademark Office*

(12) INTER PARTES REEXAMINATION CERTIFICATE (0283rd)
United States Patent
Zarnowski et al.

(10) Number: US 7,057,150 C1
(45) Certificate Issued: Jul. 19, 2011

(54) SOLID STATE IMAGE WITH REDUCED NUMBER OF TRANSISTORS PER PIXEL

(75) Inventors: Jeffrey J. Zarnowski, McGraw, NY (US); Samuel D. Ambalavanar, Rochester, NY (US); Michael E. Joyner, Cortland, NY (US); Ketan V. Karia, Cortland, NY (US)

(73) Assignee: Credit Suisse, New York, NY (US)

Reexamination Request:
No. 95/001,252, Feb. 1, 2010

Reexamination Certificate for:
Patent No.: 7,057,150
Issued: Jun. 6, 2006
Appl. No.: 10/673,591
Filed: Sep. 29, 2003

Certificate of Correction issued Sep. 19, 2006.

Related U.S. Application Data

(63) Continuation-in-part of application No. 09/768,124, filed on Jan. 23, 2001, now Pat. No. 6,633,029, which is a continuation-in-part of application No. 09/490,374, filed on Jan. 24, 2000, now Pat. No. 6,590,198, which is a continuation-in-part of application No. 09/039,835, filed on Mar. 16, 1998, now Pat. No. 6,084,229.

(51) Int. Cl.
*H01J 40/14* (2006.01)
*H04N 5/335* (2006.01)
*H04N 3/15* (2006.01)

(52) U.S. Cl. .............. 250/214 R; 250/208.1; 348/E5.091; 348/E3.018; 348/E3.021; 348/E3.02; 348/E3.029

(58) Field of Classification Search .......... None
See application file for complete search history.

(56) References Cited

U.S. PATENT DOCUMENTS

| | | | |
|---|---|---|---|
| 4,122,311 A | 10/1978 | Klatt et al. |
| 4,581,644 A | 4/1986 | Deiss |
| 4,590,609 A | 5/1986 | Chevalet et al. |
| 4,809,075 A | 2/1989 | Akimoto et al. |
| 4,827,336 A | 5/1989 | Acampora et al. |
| 4,827,345 A | 5/1989 | Nakagawa et al. |
| 4,843,473 A | 6/1989 | Bencuya et al. |
| 4,914,519 A | 4/1990 | Hashimoto et al. |
| 4,942,474 A | 7/1990 | Akimoto et al. |
| 4,967,067 A | 10/1990 | Hashimoto et al. |
| 5,134,489 A | 7/1992 | Sauer |
| 5,144,525 A | 9/1992 | Saxe et al. |

(Continued)

FOREIGN PATENT DOCUMENTS

| | | |
|---|---|---|
| EP | 616464 | 9/1994 |
| EP | 0714134 A1 | 5/1996 |
| EP | 0737003 | 10/1996 |

(Continued)

OTHER PUBLICATIONS

Loulou et al., A 3.3V Switched–Current Second Order Sigma–Delta Modular for Audio Applications, IEEE Int'l Symposium on Circ. and Sys., May 28, 2000, pp. 409–412, vol. 4.

(Continued)

*Primary Examiner*—Erik Kielin

(57) ABSTRACT

A solid state imager with pixels arranged in columns and rows has the pixels are configured into groups of at least a first pixel and a second pixel, each said group sharing a pixel output transistor having a sense electrode and output electrode and a reset transistor having a gate coupled to receive a reset signal and an output coupled to the sense electrode of the associated shared pixel output transistor. Each of the pixels has a photosensitive element whose output electrode is coupled to the sense electrode of the shared pixel output transistor and a gate electrode coupled to receive respective first and second pixel gating signals. This configuration reduces the number of FETs to two transistors for each pair of pixels, and also can achieve true correlated double sampling correction of FPN.

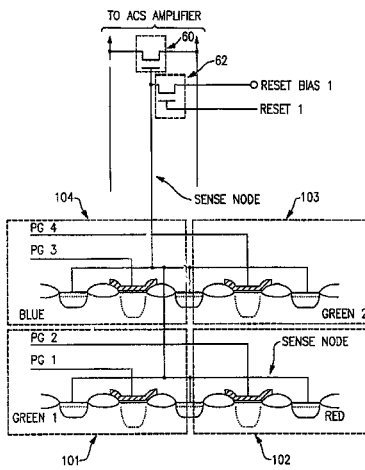

U.S. PATENT DOCUMENTS

| | | |
|---|---|---|
| 5,148,268 A | 9/1992 | Tandon et al. |
| 5,153,731 A | 10/1992 | Nagasaki et al. |
| 5,172,249 A | 12/1992 | Hashimoto |
| 5,262,871 A | 11/1993 | Wilder et al. |
| 5,264,741 A | 11/1993 | Srinivasan et al. |
| 5,295,104 A | 3/1994 | McClure |
| 5,296,696 A | 3/1994 | Uno |
| 5,317,406 A | 5/1994 | Kobayashi et al. |
| 5,434,619 A | 7/1995 | Yonemoto |
| 5,434,822 A | 7/1995 | Deleganes et al. |
| 5,471,515 A | 11/1995 | Fossum et al. |
| 5,493,423 A | 2/1996 | Hosier |
| 5,512,750 A | 4/1996 | Yanka et al. |
| 5,521,639 A | 5/1996 | Tomura et al. |
| 5,528,643 A | 6/1996 | Hynecek |
| 5,541,402 A | 7/1996 | Ackland et al. |
| 5,543,838 A | 8/1996 | Hosier et al. |
| 5,568,203 A | 10/1996 | Lee |
| 5,576,763 A | 11/1996 | Ackland et al. |
| 5,587,596 A | 12/1996 | Chi et al. |
| 5,602,585 A | 2/1997 | Dickinson et al. |
| 5,608,243 A | 3/1997 | Chi et al. |
| 5,614,744 A | 3/1997 | Merrill |
| 5,625,210 A | 4/1997 | Lee et al. |
| 5,631,704 A | 5/1997 | Dickinson et al. |
| 5,635,705 A | 6/1997 | Saunders |
| 5,638,121 A | 6/1997 | Hosier et al. |
| 5,665,959 A | 9/1997 | Fossum et al. |
| 5,708,263 A | 1/1998 | Wong |
| 5,712,932 A | 1/1998 | Alexander et al. |
| 5,717,199 A | 2/1998 | Carbone et al. |
| 5,736,733 A | 4/1998 | Shima et al. |
| 5,739,562 A | 4/1998 | Ackland et al. |
| 5,786,588 A | 7/1998 | Takahashi |
| 5,789,736 A | 8/1998 | Kawahara |
| 5,790,191 A | 8/1998 | Zhang |
| 5,860,013 A | 1/1999 | Chan |
| 5,872,470 A | 2/1999 | Mallinson et al. |
| 5,881,184 A | 3/1999 | Guidash |
| 5,894,431 A | 4/1999 | Price |
| 5,898,168 A | 4/1999 | Gowda et al. |
| 5,949,483 A | 9/1999 | Fossum et al. |
| 5,955,753 A | 9/1999 | Takahashi |
| 5,970,115 A | 10/1999 | Colbeth et al. |
| 5,973,311 A | 10/1999 | Sauer et al. |
| 5,986,510 A | 11/1999 | Graeve et al. |
| 6,008,486 A | 12/1999 | Stam et al. |
| 6,011,751 A | 1/2000 | Hirabayashi |
| 6,040,570 A | 3/2000 | Levine et al. |
| 6,043,478 A | 3/2000 | Wang |
| 6,115,066 A | 9/2000 | Gowda et al. |
| 6,118,310 A | 9/2000 | Esch |
| 6,127,697 A | 10/2000 | Guidash |
| 6,130,423 A | 10/2000 | Brehmer et al. |
| 6,130,554 A | 10/2000 | Kolze et al. |
| 6,141,045 A | 10/2000 | Tewinkle et al. |
| 6,160,281 A | 12/2000 | Guidash |
| 6,172,352 B1 | 1/2001 | Liu |
| 6,175,383 B1 | 1/2001 | Yadid-Pecht et al. |
| 6,222,175 B1 | 4/2001 | Krymski |
| 6,222,389 B1 | 4/2001 | Williams |
| 6,248,991 B1 | 6/2001 | Chen et al. |
| 6,249,471 B1 | 6/2001 | Roy |
| 6,249,618 B1 | 6/2001 | Hou |
| 6,252,217 B1 | 6/2001 | Pyyhtia et al. |
| 6,265,893 B1 | 7/2001 | Bates |
| 6,289,139 B1 | 9/2001 | Chen et al. |
| 6,320,616 B1 | 11/2001 | Sauer |
| 6,352,869 B1 | 3/2002 | Guidash |
| 6,366,320 B1 | 4/2002 | Nair et al. |
| 6,377,304 B1 | 4/2002 | Saitoh |
| 6,388,241 B1 | 5/2002 | Ang |
| 6,421,085 B1 | 7/2002 | Xu |
| 6,462,365 B1 | 10/2002 | He et al. |
| 6,466,265 B1 | 10/2002 | Lee et al. |
| 6,476,864 B1 | 11/2002 | Borg et al. |
| 6,486,913 B1 | 11/2002 | Afghahi et al. |
| 6,512,546 B1 | 1/2003 | Decker et al. |
| 6,519,371 B1 | 2/2003 | Pain et al. |
| 6,618,083 B1 | 9/2003 | Chen et al. |
| 6,624,850 B1 | 9/2003 | Guidash |
| 6,631,217 B1 | 10/2003 | Funatsu et al. |
| 6,657,665 B1 | 12/2003 | Guidash |
| 6,661,457 B1 | 12/2003 | Mathur et al. |
| 6,684,000 B1 | 1/2004 | Sakurai et al. |
| 6,686,765 B2 | 2/2004 | Ruesch |
| 6,693,670 B1 | 2/2004 | Stark |
| 6,731,335 B1 | 5/2004 | Kim et al. |
| 6,734,906 B1 | 5/2004 | Hashimoto |
| 6,784,928 B1 | 8/2004 | Sakurai et al. |
| 6,801,258 B1 | 10/2004 | Pain et al. |
| 6,831,690 B1 | 12/2004 | John et al. |
| 6,864,706 B1 | 3/2005 | Ruesch |
| 6,867,804 B1 | 3/2005 | Kim et al. |
| 6,965,407 B2 | 11/2005 | Boemler et al. |
| 6,980,243 B2 | 12/2005 | Miyawaki et al. |
| 7,440,017 B2 | 10/2008 | Endo et al. |
| 7,471,326 B2 | 12/2008 | Yonemoto |
| 2002/0018131 A1 | 2/2002 | Kochi |
| 2002/0063198 A1 | 5/2002 | Kymski et al. |
| 2005/0012836 A1 | 1/2005 | Guldash |

FOREIGN PATENT DOCUMENTS

| | | |
|---|---|---|
| EP | 1115244 | 7/2001 |
| EP | 954032 | 8/2008 |
| GB | 2332586 | 6/1999 |
| GB | 2350513 | 11/2000 |
| JP | S52-147018 | 12/1977 |
| JP | S61-023475 | 1/1986 |
| JP | S63-084316 | 4/1988 |
| JP | S63-100879 | 5/1988 |
| JP | S63-153970 | 6/1988 |
| JP | S63-100879 | 8/1988 |
| JP | S63-318875 | 12/1988 |
| JP | H2-011073 | 1/1990 |
| JP | H2-210694 | 8/1990 |
| JP | H04-004681 | 1/1992 |
| JP | H04-004682 | 1/1992 |
| JP | H05-121713 | 5/1993 |
| JP | H5-207376 | 8/1993 |
| JP | H8-195908 | 7/1996 |
| JP | H8-317125 | 11/1996 |
| JP | H9-046596 | 2/1997 |
| JP | H9-092732 | 4/1997 |
| JP | H9-107507 | 4/1997 |
| JP | H10-097724 | 4/1998 |
| JP | S63-153970 | 6/1998 |
| JP | H11-126895 | 5/1999 |
| JP | H11-146278 | 5/1999 |
| JP | H11-312800 | 11/1999 |
| JP | H11-355662 | 12/1999 |
| JP | 2000-78475 | 3/2000 |
| JP | 2000-152086 | 5/2000 |
| JP | 2000-162577 | 6/2000 |
| JP | 2000-232216 | 8/2000 |
| JP | 2001-83407 | 3/2001 |
| JP | 2001-298177 | 10/2001 |
| JP | 2002-325204 | 11/2002 |
| KR | 1993-0007531 | 8/1993 |
| WO | WO 9824059 | 6/1998 |

OTHER PUBLICATIONS

Yusim et al., Simulator For Switched–Current Integrated Circuits, IEEE 1998 Custom Integrated Cicuits Conference, 1998, pp. 459–462.

Pereira et al., Design of a Measurement and Interface . . . of Switched Current Memory Cells, Eleventh Int'/ Conf on VLSI Design: VLSI for Signal Processing, 1998, pp. 240–243.

Zeng et al., Design of Nonlinear Switched–Current Circuits Using Building Block Approach, IEEE Asia South Pacific Design Automation Conference, 1998, pp. 409–414.

Seng, New Current Conveyor for High–Speed Low–Power Current Sensing, IEEE Proc.—Circuits Devices Syst., Apr. 1998, pp. 85–89, vol. 145, No. 2.

Wang et al., Accurate CMOS Switched–Current Divider Circuits, Proceedings of the 1988 IEEE International Symposium on Circuits and Systems, 1998, pp. 53–56, vol. 1.

Halfenstein et al., Distortion Analysis of Switched–Current Circuits, Proceedings of the 1998 IEEE International Symposium on Circuits and Systems, 1998, pp. 29–32, vol. 1.

Zeng et al., New Switched–Current Circuits for Nonlinear Signal Proceesing, Proc. of the 1998 IEEE Interntional Symposium on Circuits and Systems, 1998, pp. 359–362, vol. 2.

Jorgensen et al., Noise Analysis of Switched–Current Circuits, Proceedings of the 1998 IEEE International Symposium on Circuits and Systems, 1998, pp. 108–111, vol. 1.

Jonsson, Sampling Jitter In High–Speed Si Circuits, Proceedings of the 1998 IEEE International Symposium on Circuits and Systems, 1998, pp. 524–526, vol. 1.

Kaiser, Two–Step Current–Memory Cells with Optimal Dynamic Range for Advanced . . . , Proc. of the 1998 IEEE Int'l Symposium on Circuits and Systems, 1998, pp. 80–83, vol. 1.

Leelavattananon et al., Very Low Charge Injection Switched–Current Memory Cell, Proc.of the 1998 IEEE Int'l Symposium on Circuits and Systems, 1998, pp. 531–534, vol. 1.

Helfenstein et al., Improved Two–Step Clock–Feedthrough Compensation Technique for Switched . . . , IEEE Trans. on Circuits and Sys.–II, Jun. 1998, pp. 739–743, vol. 45, No. 6.

Manganaro et al., A Four–Quadrant $S^2I$ Switched–Current Multiplier, IEEE Transactions on Circuits and Systems–II, Jul. 1998, pp. 791–799, vol. 45, No. 7.

Aronhime et al., Converting CCIIs to CFOAs in Current–Mode Circuits, 1998 Midwest Symposium on Systems and Circuits, 1998, pp. 1–4.

Garcia–Andrade et al., Performance Comparison of Switched–Current Basic Cells, 1998 Midwest Symposium on Systems and Circuits, 1998, pp. 216–219.

Gu et al., A Novel Switched–Current Sorter Based on Magnitude, Proc. 1998 5th International Conf. on Solid–State and Integrated Circuit Technology, 1998, pp. 393–396.

Wang et al., A New Current–Mode Sense Amplifier for Low–Voltage Low–Power SRAM Design, ASIC Conference 1998, Proc. Eleventh Annual IEEE Int'l ASIC Conf., Sep. 1998, pp. 163–167.

Min et al., New Clock–Feedthrough Compensation Scheme for Switched–Current Circuits, IEEE Transactions on Circuits and Systems–II, Nov. 1998, vol. 45, No. 11.

Manaresi et al., A Micropower Current Mode CMOS Function Approximation Circuit, VLSI Technology, Int'l Symposium on Systems and Applications, 1999, 290–293.

Higashimura et al., Realization of Current–Mode Multifunction Filters Using Multiple–Output Current Conveyors, The First IEEE Asia Pacific Conference on ASICs, 1999, pp. 55–58.

Fabre et al., A Novel Class AB First Generation Current Conveyor, IEEE Trans. on Circuits and Systems–II: Analog and Digital Signal Proc., Jan. 1999, pp. 96–98, vol. 46, No. 1.

Delarosa et al, Harmonic Distortion in Fully–Differential Switched–Current Sigma–Delta Modulators, IEEE 3rd Int'l Workshop on Design of Mixed–Mode Integ. Cir., 1999, pp. 134–137.

Renovell et al., Testing Switched–Current Memory Cells Using DC Stimuli, IEEE 3rd Int'l Workshop on Design of Mixed–Mode Integ. Cir. and App., 1999, pp. 25–28.

Chan et al., Universal Switched–Current Integrator Blocks for SI Filter Design, Proc. of the ASP–DAC '99, 1999, pp. 261–264, vol. 1.

Awad et al., New CMOS Realization of the CCII, IEEE Transactions on Circuits and Systems–II: Analog and Digital Signal Processing, Apr. 1999, pp. 460–463, vol. 46, No. 4.

Aronhime et al., Current–Mode Frequency Discriminators, 42nd Midwest Symposium on Circuits and Systems, 1999, pp. 1017–1020, vol. 2.

Wang et al., Design and Analysis of High Performance Current Reference Generators for Low–Power CMOS . . . , IEEE Trans. on Cir. and Sys.–II, May 1999, pp. 647–652, vol. 46, No. 5.

Martins et al., Very Low–Distortion Fully Differential Switched–Current Memory Cell, IEEE Trans. on Cir. and Sys.–II, May 1999, pp. 640–643, vol. 46, No. 5.

Dudek et. al., A CMOS General–Purpose Sampled–Data Analog Processing Element, IEEE Trans. on Cir. and Sys.–II, May 2000, pp. 467–473, vol. 47, No. 5.

Raut, An Wideband Current Mode Differentiator Network in CMOS Technology and its Application, 1999 IEEE Canadian Conf. on Electrical and Comp. Engr, May 1999, pp. 519–524, vol. 3.

Genov et al., 16–Channel Single–Chip Current–Mode Track–and–Hold Acquisition System with . . . , Proc, of the 1999 IEEE Int'l Symp. on Cir. and Sys., Jul. 1999, pp. 350–353, vol. 6.

Hughes et al., Error Neutralisation in Switched–Current Memory Cells, Proc. of the 1999 IEEE Int'l Symposium on Cir. and Sys., Jul. 1999, pp. 460–463, vol. 2.

Worapishet et al., Error Neutralised Switched–Current Comparator, Proc. of the 1999 IEEE Int'l Symposium on Cir. and Sys., Jul. 1999, pp. 464–467, vol. 2.

Wang et al., Design of a Transistor–Mismatch–Insensitive Switched–Current Memory Cell, Proc. of the 1999 IEEE Int'l Symposium on Cir. and Sys., Jul. 1999, pp. 105–108, vol. 2.

Bruun, On Dynamic Range Limitations of CMOS Current Conveyors, Proc. of the 1999 IEEE Int'l Symposium on Cir. and Sys., Jul. 1999, pp. 270–273, vol. 2.

Worapishet et al., Double–Regenerated Switched–Current Comparator, The 6th IEEE International Conference on Electronics, Circuits and Systems, 1999, pp. 1531–1534, vol. 3.

Berg et al., Ultra Low Voltage Current Multiplier/Divider, The 6th IEEE Intl'l Conf. on Electronics, Circuits and Systems, 1999, pp. 1369–1372, vol. 3.

Wawryn et al., Prototype Current Mode Circuits for Programmable WTA Network, The 6th IEEE Int'l Conf. on Electronics, Circuits and Systems, 1999, pp. 1013–1016, vol. 2.

Alves et al., A Differential Current–Conveyor Based Buffer for High–Bandwidth, Low–Signal Applications, 6th IEEE Int'l Conf. on Electr., Circ. & Sys., 1999, pp. 903–906, vol. 2.

Renovell et al., Functional and Structural Testing of Switched–Current Circuits, Proc. European Test Workshop 1999, May 1999, pp. 22–27.

Kayed et al., VLSI Design and Implementation of CMOS Current Conveyors, The Eleventh International Conference on Microelectronics, Nov. 1999, pp. 55–57.

Stefanelli et al., An Analog Beam–Forming Circuit for Ultrasound Imaging Using Swicthed–Current . . . , IEEE Journal of Solid–State Circuits, Feb. 2000, pp. 202–211, vol. 35, No. 2.

Tielo–Cuautle et al., Synthesis of the CCII—Using the Nullor Concept, Proc. of the 2000 Third IEEE Int'l Caracas COnference on Devices, Circuits and Systems, 2000, pp. 1–4.

Luh et al., A Continuous–Time Common–Mode Feedback Circuit (CMFB) for High–Impedance Current–Mode . . . , IEEE Trans. on Cir. and Sys.–II, Apr. 2000, pp. 363–369, vol. 47, No. 4.

Luh et al., A High–Speed Fully Differential Current Switch. IEEE Trans. on Circ. and Sys.–II, Apr. 2000, pp. 358–363, vol. 47, No. 4.

El–Adawy et al., A Novely Fully Differential Current Conveyor and Applications for Analog VLSI, IEEE Trans. on Circ. and Sys.–II, Apr. 2000, pp. 306–313, vol. 47, No. 4.

Handkiewicz et al., Switched–Current Filter Design for Image Processing Systems, Proc.13th Annual IEEE Int'l ASIC/SOC Conf., 2000, pp. 8–12.

Gatti et al., Use of Switched Buffers in Very High–Speed Data Converters, 2000 Southwest Symposium on Mixed–Signal Design, 2000, pp. 93–96.

Guggenbuhl, et al., Switched–Current Memory Circuits for High Precision Applications, IEEE Journal of Solid–State Circuits, Sep. 1994, pp. 1108–1116, vol. 29, No. 9.

Tawfik et al., Analog VLSI Design of Supervised–Learnable Neural Cell Using Switched—Current Technique, IEEE Int'l Symposium on Cir. and Sys., May 2000, pp. 289–292, vol. 2.

Vlassis et al., Current–Mode Non–Linear Building Blocks Based on Floating–Gate Transistors, IEEE Int'l Symposium on Cir. and Sys., May 2000, pp. 521–524, vol. 2.

Bruck et al., Novel Design Technique for Highly Linear Current Mode Amplifiers, Analysis, Design, Simulations, IEEE Int'l Symp. on Cir. and Sys., May 2000, pp. 695–698, vol. 1.

Becvar et al., Novel Universal Active Block: A Universal Current Conveyor, IEEE Int'l Symposium on Cir. and Sys., May 2000, pp. 471–474, vol. 3.

Georgantas et al., Switched–Current $\Sigma\Delta$ Modulator for Baseband Channel Applications, IEEE Int'l Symposium on Cir. and Sys., May 2000, pp. 413–416, vol. 4.

Coulombe et al., Variable Resolution CMOS Current Mode Active Pixel Sensor, IEEE Int'l Symposium on Cir. and Sys., May 2000, pp. 293–296, vol. 2.

Rout et al., Design of 1 V Switched–Current Cells in Standard CMOS Process, IEEE Int'l Symposium on Cir. and Sys., May 2000, pp. 421–424, vol. 2.

Panagiotopoulos et al., A Current–Mode Exponential Amplifier, IEEE Transactions on Circuits and Systems–II, Jun. 2000, pp. 548–552, vol. 47, No. 6.

De La Rosa et al., A CMOS 0.8–µm Transistor–Only 1.63–MHz Switched–Current Bandpass $\Sigma\Delta$ Modulator . . . , IEEE Journal of Solid–State Cir., Aug. 2000, pp. 1220–1226, vol. 35, No. 8.

Yu et al., Bi–Directional Current–Mode Multiple Input Maximum Circuit, Proc. of the Second IEEE Asia Pacific Conference on ASICs, Aug. 2000, pp. 41–44.

Azhari et al., A Novel Current Mode Instrumentation Amplifier (CMIA) Topology, IEEE Transactions on Instrumentation and Measurement, Dec. 2000, pp. 1272–1277, vol. 49, No. 6.

Demosthenous et al., High–Speed Replicating Current Comparators for Analog Convolutional Decoders, IEEE Trans. on Cir. and Sys.–II, Dec. 2000, pp. 1405–1412, vol. 47, No. 12.

Sugimoto, A 1.5–V Current–Mode CMOS Sample–and–Hold IC with 57–dB S/N at 20 MS/s and 54–dB S/N . . . , IEEE Journal of Solid–State Circuits, Apr. 2001, pp. 696–700, vol. 36, No. 4.

Worapishet et al., Speed and Accuracy Enhancement Techniques for High–Performance Switched–. . . , IEEE Journal of Solid–State Circuits, Apr. 2001, pp. 687–690, vol. 36, No. 4.

Mourao et al., Automatic Symbolic Evaluation of Non–Ideal Effects in SI Circuit Behavior, 3rd Int'l Workshop on Design of Mixed–Mode Integrated Circ. and App., 1999, pp. 40–44.

Nixon et al., 128×128 CMOS Photodiode—Type Active Pixel Sensor With On–Chip Timing, Control and Signal Chain Electronics, Proc. of SPIE, 1995, pp. 117–123, vol. 2415.

Sauer et al., 640×480 PtSI MOS Infrared Imager, Proc. of SPIE, 1992, pp. 79–90, vol. 1685.

Silburt et al., A 180–MHz 0.8–µm BICMOS Modular Memory Family of DRAM and Multiport SRAM, IEEE Journal of Solid–State Circuits, Mar. 1993, pp. 222–232, vol. 28, No. 3.

Stewart et al., A 40 ns CMOS $E^2$PROM, IEEE Journal of Solid–State Circuits, Oct. 1982, pp. 841–846, vol. SC–17, No. 5.

Stewart et al., A 40 ns CMOS $E^2$PROM, IEEE Journal of Solid–State Circuits, Oct. 1982, pp. 841–846, vol. SC–17, No. 5.

Izumikawa et al., 400MHz, 300mW, 8kb, CMOS SRAM Macro With a Current Sensing Scheme, Proc. of IEEE 1994 Custom Integrated Circuits Conf., 1994, pp. 595–598.

Lomas et al., A High Resolution Electron Imaging Integrated Circuit, Proceedings of the 23rd European Solid–State Circuits Conf., Sep. 1997, pp. 324–327.

Fossum, Active Pixel Sensors vs. Charge–Coupled Devices, 1993 IEEE Worshop on CCDs and Advanced Imaged Sensors, pp. 1–24.

Fossum, Charge–Coupled Computing for Focal Plane Image Preprocessing, Optical Engineering, Sep. 1987, pp. 916–922, vol. 26, No. 9.

Kemeny et al., CMOS Active Pixel Sensor Array with Programmable Multiresolution Readout, Program of 1995 IEEE Workshop in CCDs and Advanced Image Sensors, Apr. 1995, pp. 1–5.

Nakase et al., Complementary Half–Swing Bus Architecture and its Application for Wide Band SRAM Macros, IEEE Proc.–Circuits Devices Sys., Oct. 1998, pp. 337–342, vol. 145, No. 5.

Philips, FTF3020–C Full Frame CCD Image Sensor Datasheet, Nov. 22, 1999, pp. 1–17.

Nixon et al., FA 11.1: 256×256 CMOS Active Pixel Sensor Camera–on–a–Chip, 1996 IEEE International Solid–State Circuits Conf., 1996, pp. 178–179, 440.

Fillfactory, IBIS4 SXGA Image Sensor, 1.3 Megapixel CMOS APS Datasheet, Jun. 19, 2001, pp. 1–38.

Degerli et al., Column Readout Circuit with Global Charge Amplifer for CMOS APS Imagers, Electronics Letters, Aug. 17, 2000, pp. 1457–1459, vol. 36, No.17.

Mansoorain et al., Megapixel CMOS APS with Analog and Digital Readout, Program of 1997 IEEE Worshop on Charge–Coupled Devices and Adv. Image Sensors, 1997, pp. R29.1–R29.4.

Tsiatouhas et al., New Memory Sense Amplifier Designs in CMOS Technology, The 7th IEEE International Conference on Electronics, Circuits & Systems, 2000, pp. 19–22, vol. 1.

Omnivision, OV7620 Single–Chip CMOS VGA Color Digital Camera Datasheet, May 13, 2000, pp. 1–60, Rev. 1.3.

Weste et al., Principles Of CMOS VLSI Design A Systems Perspective, Second Edition, 1993, pp. 1–40.

Chi et al., Process, Voltage and Temperature Compensation of Off–Chip–Driver Circuits for sub–0.25–μm CMOS . . . , 10th Annual IEEE Int'l ASIC Conf. and Exhibit, 1997, pp. 279–28.

Panicacci et al., Programmable Multiresolution CMOS Active Pixel Sensor, Proc. of SPIE, pp. 72–79, 1996, vol. 2654.

ICECS 2000, Table of Contents of The 7th IEEE International Conference on Electronics, Circuits & Systems, Dec. 2000, pp. i–xvii, vol. I of II.

IEEE, Table of Contents of International Electron Devices Meeting 1999, Dec. 1999.

IEEE, Table of Contents of Tenth Annual IEEE International ASIC Conference and Exhibit, Proceedings, 1997, pp. i–xviii.

Vogelsong et al., Scientific/Industrial Camera–on–a–Chip using Active Column Sensor CMOS Imager Core, Proc. of SPIE, 2000, pp. 102–113, vol. 3965.

Mendis et al., CMOS Active Pixel Image Sensors for Highly Integrated Imaging Systemms, IEEE Journal of Solid–State Circuits, Feb. 1997, pp. 187–197, vol. 32, No. 2.

Uyemura, CMOS Logic Circuit Design, 1999, pp. 350–374, Kluwer Academic Publishers Group.

Zarnowski et al., Imaging Options Expand with CMOS Technology, Laser Focus World, Jun. 1997, pp. 125–130.

Zarnowski et al, Analysis and Results of a Random Access Charge Injection Device, Program of IEEE Workshop on Charge–Coupled Devices and Advanced Image Sensors, 1993, pp. 1–32.

Bouffault et al., High speed cameras using CCD image sensor and a new high speed image sensor for biological applications, Proc. of SPIE, May 1995, p. 252–258, vol. 2513.

Omnivision, CameraChip Datasheet—OVT CameraChip OV9620/9120, Feb. 22, 2002, pp. 1–23.

Iodice et al., Ultra high speed CMOS scanning linear imager family, Proc. of SPIE, Jan. 2001, pp. 100–110, vol. 4306.

Zarnowski et al., Active Pixel CMOS sensors improve their image, Laser Focus World, Jul. 1999, pp. 111–122.

Zarnowski et al., Selectable one to four port, veri high speed 512×512 Charge Injection Device, Proc. of SPIE, Jul. 1991, pp. 191–201, vol. 1447.

Zarnowski et al., Scientific CMOS CID Imagers, Proc. of SPIE, Mar. 1996, pp. 29–37, vol. 2654.

Zarnowski et al., 1.5 FET per pixel standard CMOS active column sensor, Proc. of SPIE, Jan. 1999, pp. 186–196, vol. 3649.

Carbone et al, "Megarad and Scientific CIDs," Proc. SPIE, vol. 2654, pp. 131–138 (1996).

Niewiadomski et al., CMOS Read–Out IC with Op–Amp Pixel Amplifier for Infrared Focal Plane Arrays, Tenth Annual IEEE International ASIC Conference and Exhibit, 1997, pp. 69–73.

Kemeny et al., Multiresolution Image Sensor, IEEE Transactions on Circuits and Systems for Video Technology, Aug. 1997, pp. 575–583, vol. 7, No.

Ricquier et al., The CIVIS Sensor: A Flexible Smart Imager With Programmable Resolution, Proc. of SPIE, The International Society for Optical Engineering, 1994, pp. 2–10.

Loianz et al., A 200–mW, 3.3–V, CMOS Color Camera IC Producing 352×288 24–b Video at 30 Frames/s, IEEE Journal of Solid State Circuits, Dec. 1988, p. 2092–2103, vol. 33, No. 12.

Tippie, VXI Data Acquisition Handbook, KineticSystems Corporation Feb. 16, 1998, Rev. 1.3, Section 3.3.

Zhou et al., Frame–Transfer CMOs Active Pixel Sensor With Pixel Binning, IEEE Transactions on Electron Devices, Oct. 1997, pp. 1764–1768, vol. 44, No. 1.

FTT1010–M Frame Transfer CCD Image Sensor Specification, Sep. 21, 1999, pp. 2–16.

Nixon et al., 256×256 CMOS Active Pixel Sensor Camera–on–a–Chip, IEEE Journal of Solid State Circuits, Dec. 1996, pp. 2046–2050, vol. 31, No. 12.

Eklund et al., VLSI Implem, of a Focal Plane Image Processor—A Realization of the Near–Sensor Image Proc. Concept, IEEE Trans. on VLSI Systems, Sep. 1996., vol. 4, No. 3.

OV6620/OV6120 Datasheet, May 14, 1999, Ver. 1.11, pp. 1–31.

Wilson, Technology Trends, CMOS imagers address fixed–patterm nonuniformity, Vision Systems Design, Dec. 1999, p. 9.

Larish, CMOS Imagers for HDTV and Hollywood, Advanced Imaging, Mar. 2002, pp. 44–45, 54.

Business Wire, JVC Revolutionizes Digital Cinematography With Photon Vision System Image Sensor, Providing Resolution Four Times Higher . . . . , Apr. 4, 2002.

Info HQ .COM, InfoHQ Computer News and Rumors, www. infohq.com/Computer/computer–news–apr02–1–7.htm, p. 1, pp. 8–9.

Clark, Sensor resolution leap for HDTV, EE Times, Apr. 11, 2002, p. 1.

Clark, Sensor resolution leap for HDTV, Silicon Strategies, Apr. 11, 2002, p.1 .

EE Times, Sensor Goes Beyond HDTV, Planet Analog, Apr. 4, 2002, p. 1.

EE Times, Sensor Goes Beyond HDTV, EE Times, Apr. 4, 2002, p. 1.

EE Times, Sensor Goes Beyond HDTV, Northern Lights, Apr. 8, 2002, p. 1.

EE Times, Sensor Goes Beyond HDTV, EE Times, Apr. 8, 2002, p. 1.

EE Times, CMOS Sensors Said To Attain CCD–Like Quality, EE Times, Jan. 3, 2000, p. 47.

Motorola, Motorola Semiconductor Technical Data—MCM20027, Nov. 28, 2001, Revision 8.0, pp. 1–73.

Kodak, Kodak KAC–1310 Image Sensor, Nov. 7, 2002, pp. 1–76.

Kleinfelder et al., A 10,000 Frames/s CMOS Digital Pixel Sensor, IEEE Journal of Solid–State Circuits, Dec. 2001, pp. 2049–2059, vol. 36., No. 122.

Yang et al., A 640×512 CMOS Image Sensor with Ultrawide Dynamic Range Floating–Point Pixel–Level ADC; IEEE Journal of Solid–State Circuits, Dec. 1999, pp. 1821–1834, vol. 34, No. 122.

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1 and 12 are cancelled.
Claims 2-11 and 13-18 were not reexamined.

\* \* \* \* \*